United States Patent [19]

Baumberger et al.

[11] Patent Number: 5,259,781
[45] Date of Patent: Nov. 9, 1993

[54] ELECTRICAL CONNECTOR ALIGNMENT AND ACTUATION ASSEMBLY

[75] Inventors: John G. Baumberger, Johnson City, N.Y.; James R. Bentlage, Underhill, Vt.; Fletcher W. Chapin; Kishor V. Desai, both of Vestal, N.Y.; Alan D. Knight, Newark Valley, N.Y.; Thomas G. Macek, Endicott, N.Y.

[73] Assignee: International Business Machines Corporation, Armonk, N.Y.

[21] Appl. No.: 977,946

[22] Filed: Nov. 18, 1992

[51] Int. Cl.⁵ ............................................ H01R 13/627
[52] U.S. Cl. ............................................ 439/362; 439/66
[58] Field of Search ..................... 439/55, 65, 66, 67, 439/68, 73, 74, 331, 374, 362, 364

[56] References Cited

U.S. PATENT DOCUMENTS

| | | | |
|---|---|---|---|
| 3,026,494 | 3/1962 | Anderson et al. | 439/66 |
| 3,082,398 | 3/1963 | Valach | 439/362 X |
| 3,904,934 | 9/1975 | Martin | 439/66 X |
| 4,066,318 | 1/1978 | Vonder et al. | 439/362 |
| 4,911,644 | 3/1990 | Bond et al. | 439/67 |
| 4,932,883 | 6/1990 | Hsia et al. | 439/66 |
| 4,948,374 | 8/1990 | Carter | 439/67 |
| 4,969,826 | 11/1990 | Grabbe | 439/66 |
| 5,061,192 | 10/1991 | Chapin et al. | 439/66 |
| 5,076,794 | 12/1991 | Ganthier | 439/70 |

Primary Examiner—Larry I. Schwartz
Assistant Examiner—Khiem Nguyen
Attorney, Agent, or Firm—Calfee, Halter & Griswold

[57] ABSTRACT

A connector assembly has a plurality of electrical circuit members and interposer frames with resilient contact members pressed together by a centrally located actuation screw. The actuation screw is supported within a threaded hole in an actuation bar on one side of one of the circuit members. Turning the actuation screw in its threaded hole causes various parts of the connector assembly to be pressed together simultaneously under an evenly distributed load. A load distribution plate located between the actuation screw and the nearest circuit member reduces the bending stresses in that circuit member. Alignment bushings and pins extending through openings in the circuit members maintain the various parts of the assembly in proper alignment while the actuation screw is being turned.

26 Claims, 8 Drawing Sheets

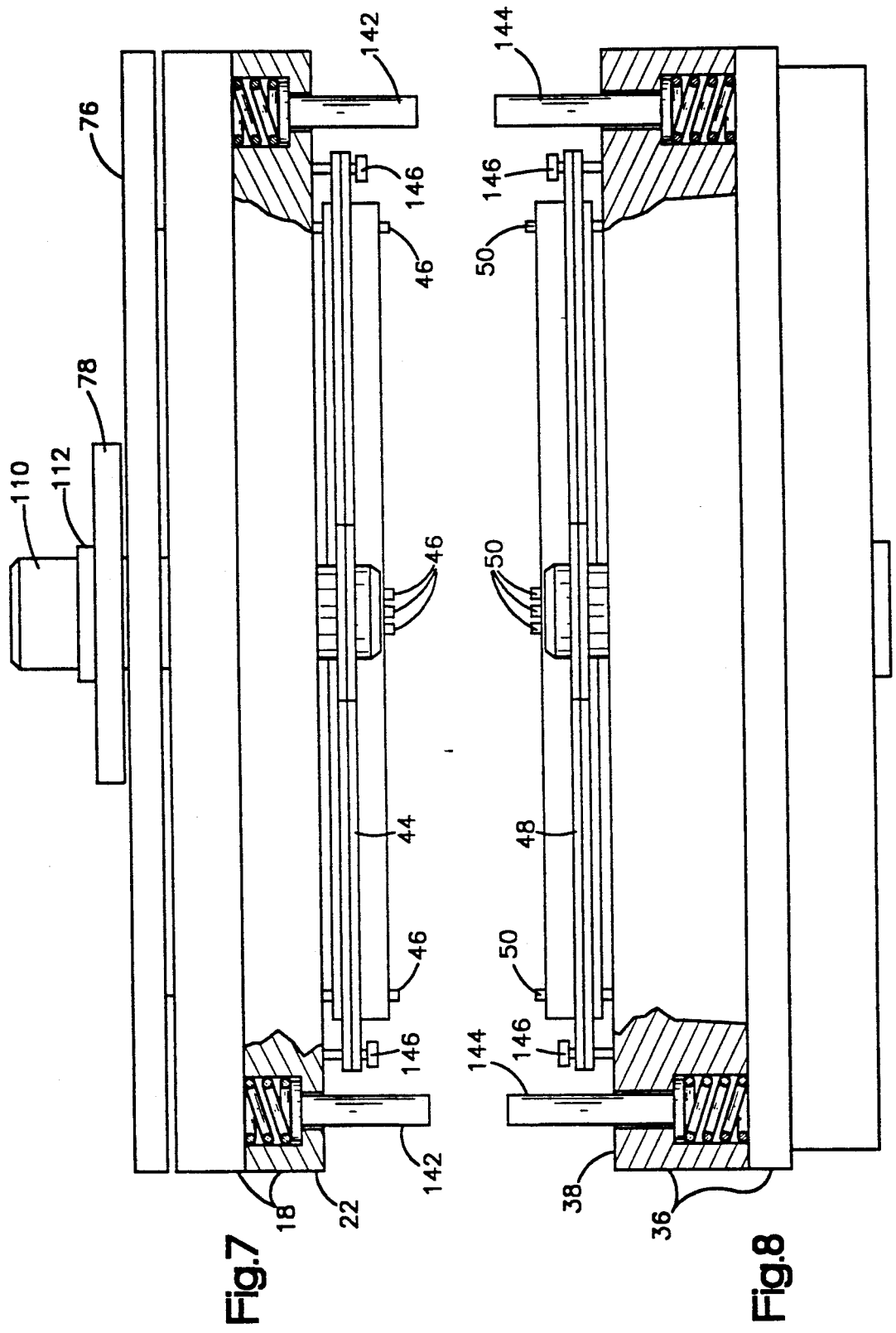

ELECTRICAL CONNECTOR ALIGNMENT AND ACTUATION ASSEMBLY

FIELD OF THE INVENTION

This invention relates to the field of electrical connectors that interconnect electrical circuits located on spaced apart panels. More particularly, the invention relates to electrical connectors of the type that are used in computer equipment.

BACKGROUND OF THE INVENTION

As the circuit density of modern semiconductor chips in modern computers has increased, there has been a greater need for more tightly packed signal and power connections between the modules carrying these chips and the circuit boards with which the chips interface. Also, this increased circuit density has led to a need for more direct power connections to the modules that carry the chips. As a result, circuit packages have been developed that employ a large central circuit board with semiconductor chip modules mounted on one side of the board and a small power supply board for each module mounted on the other side of the board. The chip modules and their power supply boards are each electrically connected to contact pads on their respective sides of the central board by resilient contact members. These contact members are mounted on interposer frames located between the modules and the central board and between the power supply boards and the central board. An example of an interposer frame with such contact members is shown in U.S. Pat. No. 5,061,192, assigned to the same assignee as the present invention, in which members 15 are mounted on an interposer frame 11 (FIGS. 2 to 4).

The large number of closely spaced contact pads and contact members located on a plurality of modules, boards and frames presents a problem of maintaining proper alignment of the contact pads with their respective contact members during assembly. Also, the modules, boards and frames must be restrained from tilting with respect to one another to insure an even pressure between all of the contact members and their pads, so that each contact member makes a good electrical connection with its pad.

Known assemblies for connecting electrical circuits on a plurality of stacked boards have not had the kind of alignment and pressure distribution features that are needed to form reliable electrical connections in the modern environment of high circuit density semiconductor chips. For instance, in U.S. Pat. No. 3,026,494, the stacked circuit boards and intermediate connector blocks are assembled by passing pins and bolts through holes in the corners of the circuit boards and in the end portions of the connector blocks. Then, nuts are threaded onto the corner bolts and each of the bolts is separately tightened against the top circuit board. While these bolts are being separately tightened, the circuit boards and connector blocks can easily become tilted with respect to one another, causing misalignment between the resilient contact arms on the connector blocks and their contact pads on the circuit boards. Also, the uneven pressure applied to the various contact members can result in faulty electrical connections between some of the members and the pads on the circuit boards.

Similar problems can occur in the assemblies shown in U.S. Pat. Nos. 3,904,934; 4,911,644; 4,932,883; 4,948,374; 4,969,826 and 5,076,794. In all of these assemblies, a plurality of nuts or bolts must be separately tightened, thus creating the likelihood of some misalignment and poor electrical contact. Of course, in the assembly of circuit boards and connectors in which the electrical contact pads are spaced relatively far apart and the resilient contact areas are of fairly large size, these alignment and contact problems are not as great as they are in assemblies containing high density electrical circuits and closely spaced contact pads.

SUMMARY OF THE INVENTION

The primary object of the present invention is to provide an electrical connector assembly in which high density electrical circuit members are joined together while maintaining their electrical contacts in accurate alignment and under even contact pressure.

Another object of the present invention is to provide an electrical connector assembly in which the circuit members and the resilient contact members between the circuit members are properly aligned prior to their being forced into electrical contact with one another.

Still another object of the present invention is to provide an electrical connector assembly having a simple, low-cost actuation system that maintains the components of the assembly in proper alignment while they are being forced together.

In one embodiment of the present invention, a connector assembly comprises first and second circuit members on opposite sides of a circuit board, interposer frames supporting resilient contact members positioned between each of the circuit members and the circuit board, the interposer frames and circuit members having pairs of aligned openings, a pair of pins extending through these pairs of aligned openings, an actuation bar positioned between the pins and on the side of the first circuit member away from the circuit board, stop devices fixed to the pins on the side of the actuation bar facing away from the circuit board and on the side of the second circuit member facing away from the circuit board, and an actuation screw threadably engaging a central hole in the actuation bar and mechanically connected to the first circuit member, whereby the turning of the actuation screw forces the circuit members toward the circuit board, thereby compressing the resilient contact members on the interposer frames against contact pads on the circuit members while maintaining all the parts of the assembly in proper alignment and under uniform contact pressure.

In a preferred embodiment, the present invention also includes a load distribution plate positioned between the first circuit member and the actuation bar and having a bossed portion that contacts the shoulder portions of the first circuit member and maintains the central portion of the load distribution plate free from contact with the central portion of the first circuit member. This load distribution plate reduces bending stresses in the first circuit member.

DESCRIPTION OF THE DRAWINGS

FIGS. 7 and 8 are side views of parts of a connector assembly illustrating a third embodiment of the present invention;

DESCRIPTION OF THE PREFERRED EMBODIMENTS

Figure 1:
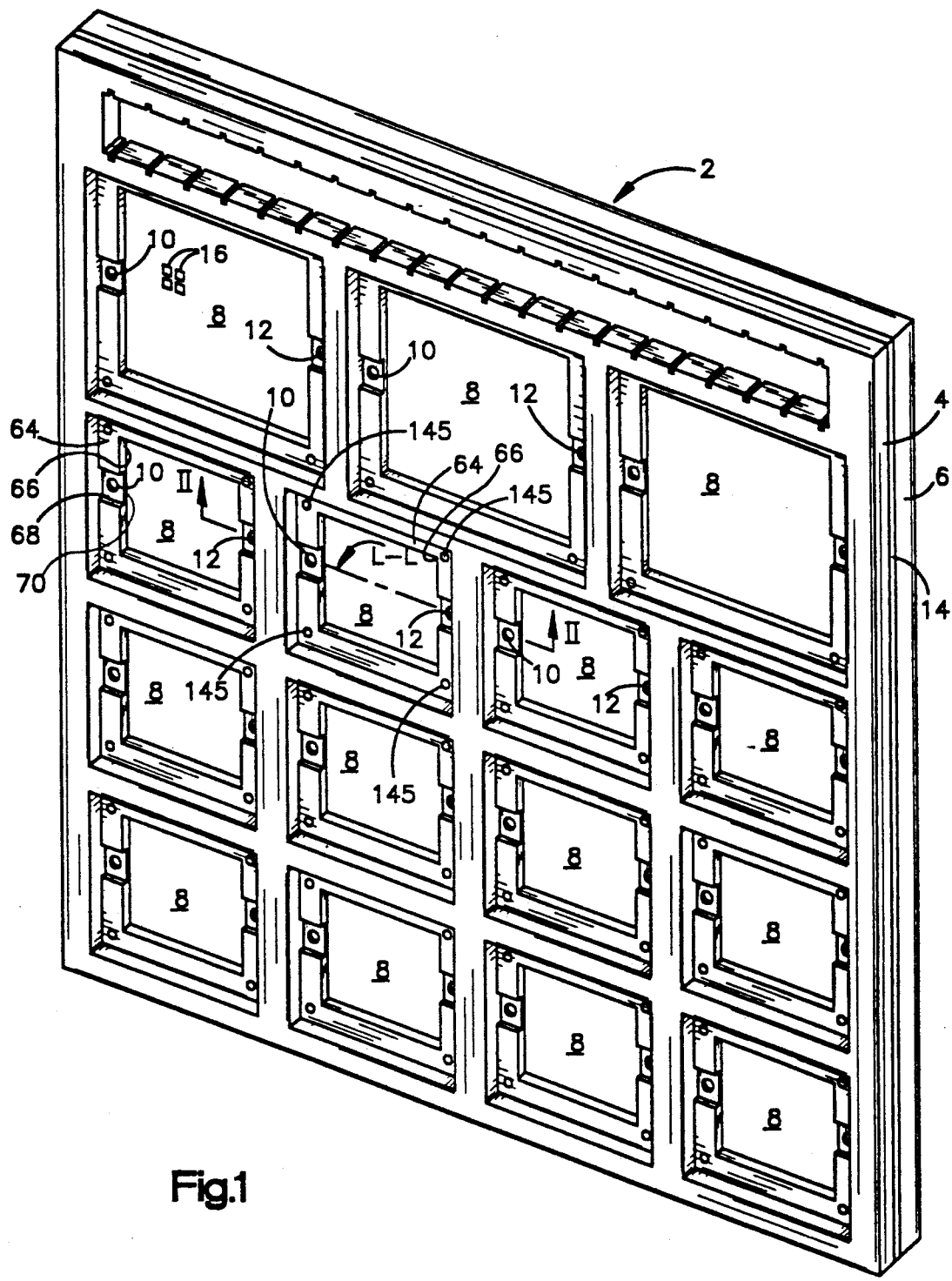
FIG. 1 is a perspective view of a circuit board that forms part of a connector assembly representing one embodiment of the present invention.

Referring to FIG. 1, a circuit board 2 is reinforced by stiffener plates 4 and 6 on either side. On one side of the circuit board 2, the stiffener plate 4 has a number of picture frame openings forming module sites 8, designed to hold semiconductor chip modules. On the other side of the board 2 and directly behind the module sites 8 are power supply board sites that are not visible in FIG. 1. Adjacent to each module site 8 and its corresponding power board site are round openings 10 and elongated slots 12, which extend through the stiffener plates 4 and 6, as well as through the main body 14 of the circuit board 2. The axes of elongation of the slots 12 are aligned with a line L—L between the centers of the openings 10 and slots 12. During assembly of the stiffener plates 4 and 6 with the main body of the board 2, the round openings 10 and elongated slots 12 in the stiffener plates 4 and 6 are registered to electrical contact pads 16 on the body of the circuit board 2. At each module site 8 and corresponding power board site on the opposite side of the circuit board 2, there are many pads 16, but for illustration purposes, only four of these pads 16 are shown at one of the sites 8 in FIG. 1.

Figure 2:
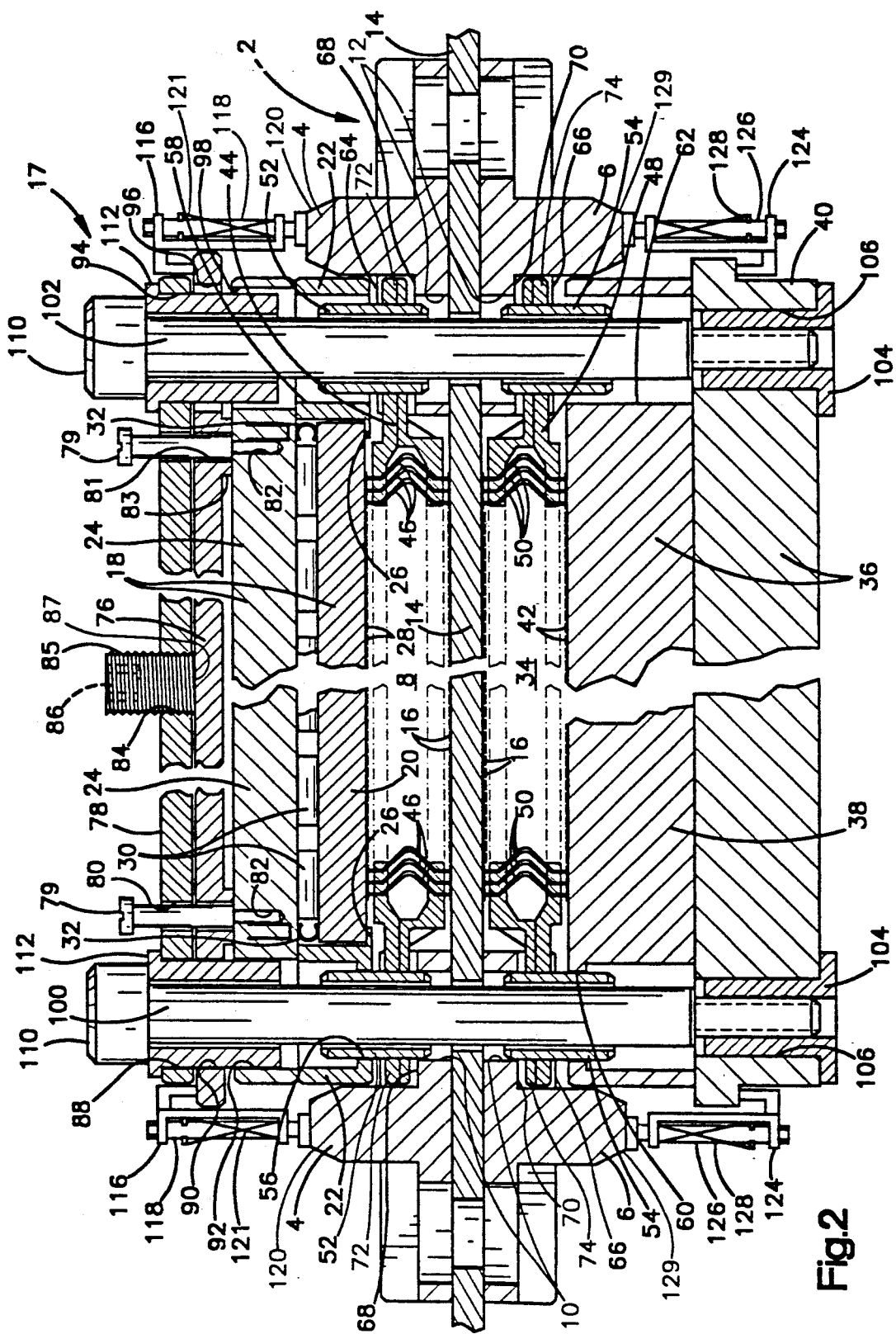
FIG. 2 is a sectional view of a connector assembly including the circuit board of FIG. 1, taken along section line II—II of FIG. 1 and showing the assembly before its components have been pressed together in their final, assembled positions.
Figure 3:
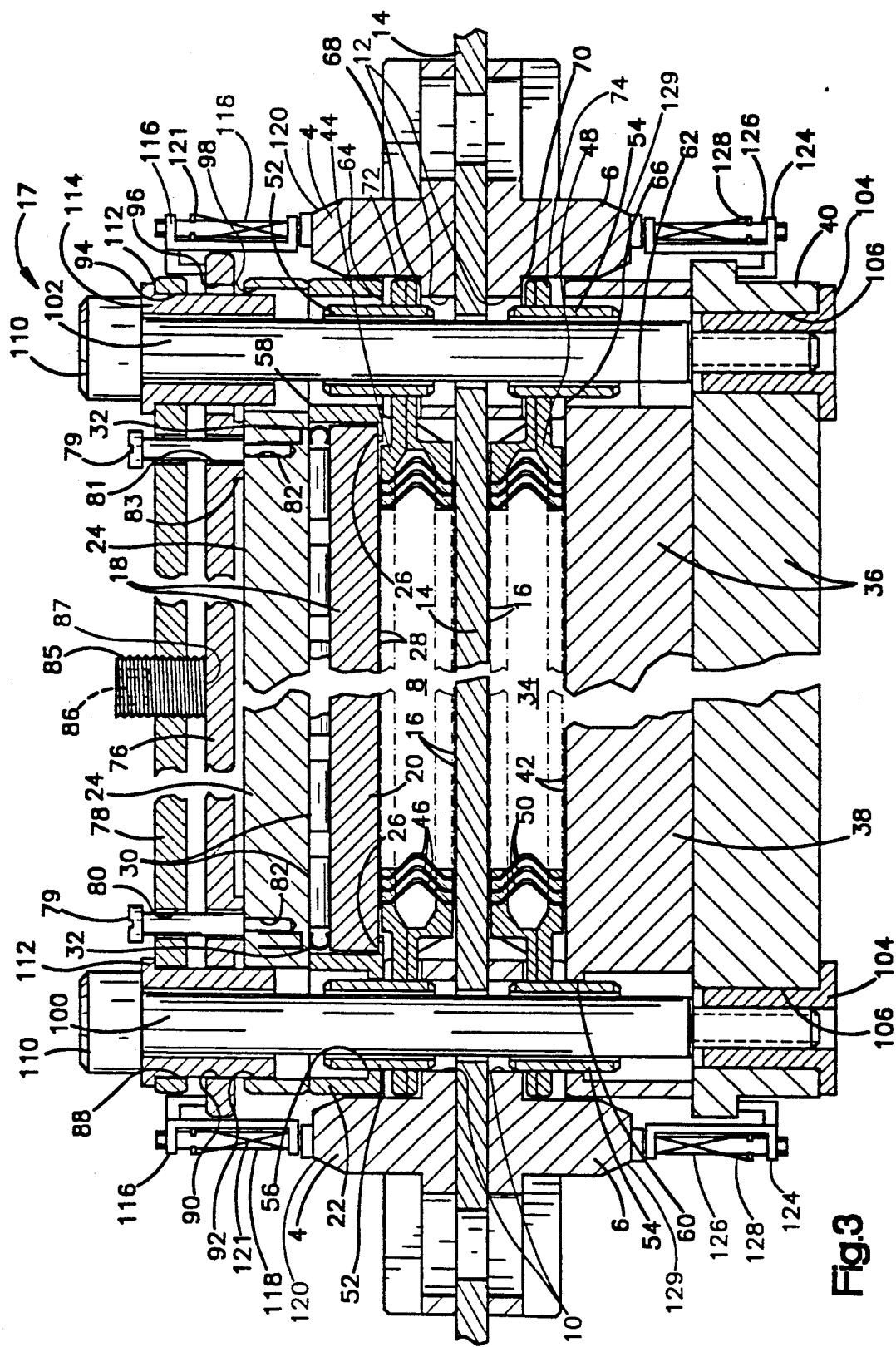
FIG. 3 is a sectional view of the connector assembly of FIG. 2, taken along section line II—II of FIG. 1 and showing the components of the assembly pressed together in their final, assembled positions.
Figure 4:
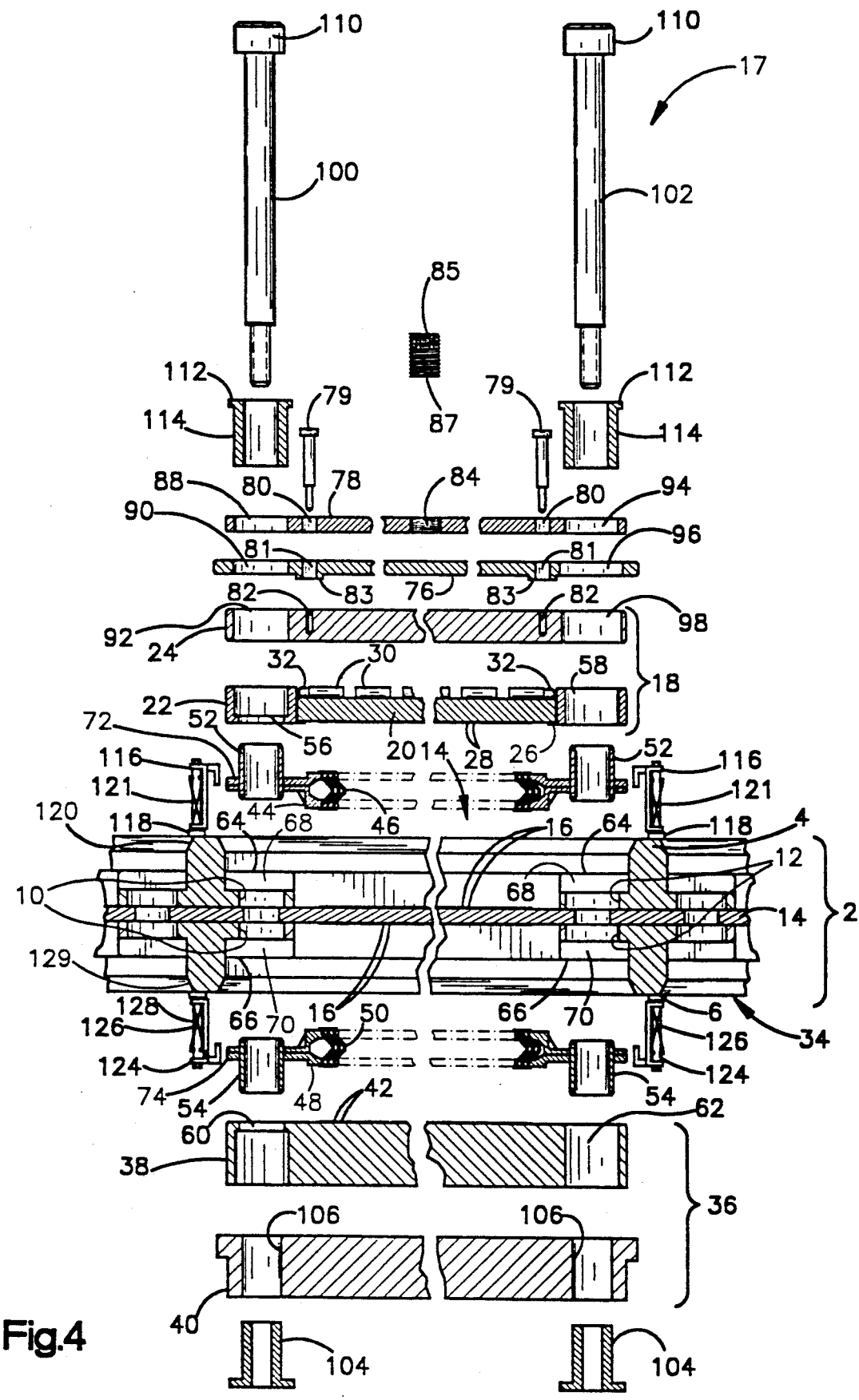
FIG. 4 is a sectional view of the connector assembly of FIGS. 2 and 3, taken along section line II—II of FIG. 1 and showing the components of the assembly in spaced apart positions.

As shown in FIGS. 2, 3 and 4, a connector assembly 17 includes, in addition to the circuit board 2, a first circuit member 18. The circuit member 18 is in turn comprised of a semiconductor chip or circuit module 20, a frame 22 and a cooling cap 24, all of which are mounted in a picture-frame shaped module site 8 formed by the stiffener plate 4 of the circuit board 2. The circuit module 20 is supported on ledges 26 of the frame 22 and has contact pads 28 on its side facing the circuit board 2. On its side facing the cooling cap 24, the circuit module 20 has semiconductor chips 30. Sealing springs 32 are positioned between the shoulders of the circuit module 20 and the cooling cap 24. The sprigs 32 force the circuit module 20 against the ledges 26 of the frame 22.

The connector assembly 17 also includes a second circuit member 36, located on the other side of the circuit board 2 and within a power board site 34 in the stiffener plate 6. The second circuit member 36 comprises a power board 38 and a cold plate 40. The power board 38 has contact pads 42 on its side facing the circuit board 2.

A first interposer frame 44 is placed between the circuit member 18 and the circuit board 2. Resilient contact members 46 are slidably supported in openings in the frame 44 for the purpose of forming electrical connections between the contact pads 28 on the circuit module 20 and the contact pads 16 of the circuit board 2 that face the pads 28. Likewise, a second interposer frame 48, placed between the circuit member 36 and circuit board 2, supports resilient contact members 50, in order to form electrical connections between the contact pads 42 on the power board 38 and the contact pads 16 of the circuit board 2.

During the assembly of the circuit board 2, the circuit members 18 and 36 and the interposer frames 44 and 48, it is very important that the contact pads 16, 28 and 42 and the resilient contact members 46 and 50 be accurately aligned with one another. To accomplish that alignment, the interposer frames 44 and 48 have alignment bushings 52 and 54 that are accurately located relative to the resilient contact members 46 and 50 on the frames 44 and 48. The frame 22 of the first circuit member 18 has a round opening 56 and elongated slot 58 that receive the bushings 52 of the first interposer frame 44. The power board 38 of the second circuit member has a round opening 60 and elongated slot 62 that receive the bushings 54 of the second interposer frame 48. The axis of elongation of the slot 58 is aligned with an imaginary line between the centers of the opening 56 and slot 58 and the axis of elongation of the slot 62 is aligned with an imaginary line between the centers of the opening 60 and slot 62. The bushings 52 and 54 of the interposer frames 44 and 48 fit very closely with the walls of the openings 56 and 60 and slots 58 and 62. However, the elongation of the slots 58 and 62 allows for a slight amount of variation between the spacing of the bushings and the spacings of the various pairs of openings that receive them.

The bushings 52 and 54 also fit within the round openings 10 and slots 12 of the stiffener plates 4 and 6 of circuit board 2. These bushings have the same close fit with the openings 10 and slots 12 as they have with the openings 56 and 60 and slots 58 and 62. Also, like the registration of the openings 10 and slots 12 to the contact pads 16 of the circuit board 2, the openings 56 and 60 and slots 58 and 62 are registered respectively to the contact pads 28 and 42 of the first and second circuit members 18 and 36. Therefore, when the circuit board 2, circuit members 18 and 36 and interposer frames 44 and 48 are assembled with the bushings 52 and 54 extending through the openings 10, 56 and 60 and slots 12, 58 and 62, the resilient contact members 46 and 50 will be accurately aligned with their proper contact pads 16, 28 and 42.

The module sites 8 and power board sites 34 are framed by ledges 64 and 66 in the stiffener plates 4 and 6. The openings 10 and slots 12 are located respectively within recesses 68 and 70 in the ledges 64 and 66. As shown in FIGS. 2, 3 and 4, the bushings 52 and 54 of the interposer frames 44 and 48 are located on frame projections 72 and 74 and these frame projections fit within the recesses 68 and 70 in the ledges 64 and 66. The non-recessed portions of the ledges 64 and 66 act as stops for the frame 22 of the first circuit member 18 and the power board 38 of the second circuit member 36. When the frame 22 and power board 38 are pressed against the resilient contact members 46 and 50, the ledges 64 and 66 limit the compression of the resilient contact members 46 and 50 and prevent their possible damage.

Preferably, the recesses 68 and 70 and their mating frame projections 72 and 74 have unique sizes, so that the interposer frames 44 and 48 and their corresponding circuit members 18 and 36 cannot be placed in the wrong module or power board sites, nor placed incorrectly in these sites.

Referring to FIGS. 2, 3 and 4, a load distribution plate 76 and actuation bar 78 are mounted on the side of the circuit member 18 that faces away from the circuit board 2. Headed pins 79 hold these parts together by passing through holes 80 in the actuation bar 78 and holes 81 in the load distribution plate 76 and into threaded holes 82 in the cooling cap 24 of the circuit member 18. The load distribution plate 76 has bossed portions 83 that contact the shoulder portions of the cooling cap 24 of the circuit member 18 and maintain the other portions of the plate 76 spaced from the cooling cap 24. In the center of the actuation bar 78 is a threaded hole 84. An actuation screw 85 in the hole 84 has a top end with a recess 86 for receiving a torque tool and a bottom end 87 that engages the load distribution plate 76.

The purpose of the load distribution plate 76 is to reduce stresses in the cooling cap 24. However, if those stresses are not deemed to present a serious problem, the load distribution plate 76 may be eliminated. The actuation screw 85 would then engage the top of the cooling cap 24. The actuation bar 78, load distribution plate 76 and cooling cap 24 have round openings 88, 90 and 92, respectively, which extend through their lateral edge portions and are aligned with the round openings 10, 56 and 60 of the circuit board 2 and circuit members 18 and 36. Likewise, round opening 94 and slots 96 and 98 extend through opposite lateral edge portions of the load distribution plate 76, actuation bar 78 and cooling cap 24. This opening and these slots are aligned with the slots 12, 58 and 62 in the circuit board 2 and circuit members 18 and 36.

On one side of the assembly 17, a pin 100 extends through the round openings 10, 56, 60, 88, 90 and 92 and also through the one set of the bushings 52 and 54 in the interposer frames 44 and 48. On the other side of the assembly 17, a pin 102 extends through the round opening 94 and slots 12, 58, 62, 96 and 98 and also through the other set of bushings 52 and 54 in the interposer frames 44 and 48. The pins 100 and 102 are secured at one end in threaded collars 104 fixed in holes 106 in the cold plate 40 of the circuit member 36. Alternatively, the collars 104 may be eliminated and the pins 100 and 102 threaded directly into holes in the cold plate 40. At their other ends, the pins 100 and 102 have heads 110 that rest on the flanged ends 112 of bushings 114. The bushings 114 extend through the round openings 88, 90, 92 and 94 and slots 96 and 98 in the actuation bar 78, load distribution plate 76, and cooling cap 24 to maintain these parts of the assembly 17 aligned with one another. Also, the pin heads 110 and bushing flanges 112 prevent the actuation bar 78 and other parts of the assembly 17 from slipping off the upper ends of the pins 100 and 102.

The assembly 17 is preferably provided with a means for temporarily holding its various parts properly aligned before the pins 101 and 102 are inserted during the assembly operation. As shown in FIGS. 2 and 3, this temporary holding means comprises spring-loaded retainers 116 pivotally mounted on studs 118 on the top side of the assembly 17. The studs 118 are mounted on raised portions 120 of the stiffener plate 4 of the circuit board 2. Compression springs 121 connected between the studs 118 and retainers 116 force the retainers 116 down against the edges of the load distribution plate 76 and thus hold together the plate 76, circuit member 18, interposer frame 44 and circuit board 2. Alternatively, the retainers 116 may be positioned so that they act directly against either the edges of the actuation bar 78 or the edges of the cooling cap 24 of the circuit member 18. In embodiment shown in FIGS. 2, 3 and 4, the actuation bar 78 is retained indirectly by the threaded pins 79 that are threaded into holes 82 of cooling cap 24. On the bottom side of the assembly 17, as viewed in FIGS. 2 and 3, the temporary holding means comprises spring-loaded retainers 124 pivotally mounted on studs 126, which are in turn connected to raised portions 129 of the stiffener plate 6. Compression springs 128 force the retainers 124 up against the edges of the cold plate 40 and thus hold together the circuit member 36, interposer frame 48 and circuit board 2, until the pins 100 and 102 can be inserted through the holes and slots in the various parts of assembly 17 and threaded into the collars 104.

In order to provide reliable contact mating forces between the contact members 46 and 50 and their associated contact pads, the various parts of the assembly 17 must be pressed together. That is accomplished by turning the actuation screw 85, which forces the load distribution plate 76 and actuation bar 78 to spread apart, as shown in FIG. 3. Two kinds of forces are generated when the actuation screw 85 is turned. One is the linear force that is distributed by the load distribution plate 76 and its bossed portions 83 to the circuit members 18 and 36, contact members 46 and 50 held in the interposer frames 44 and 48 and circuit board 2, forcing those members closer together, until the frame 22 and power board 38 seat firmly against the ledges 64 and 66 on the stiffener plates 4 and 6. That force causes the resilient contact members 46 and 50 to be compressed firmly against their associated contact pads, as shown in FIG. 3. The other force transmitted by turning the actuation screw 85 is an unwanted twisting moment that tends to rotate the actuation bar 78, the load distribution plate 76 and other parts of the assembly relative to one another. However, the bushings 114 in the round openings 88 and 90 and slots 92, 94, 96 and 98 of the load distribution plate 76, actuation bar 78 and cooling cap 24 absorb that twisting moment and prevent those parts from rotating. Also, the bushings 52 and 54 prevent the frame 22 of circuit member 18, the power board 38, the circuit board 2 and the interposer frames 44 and 48 from rotating relative to one another. In addition, any tendency of the interposer frames 44 and 48 to tip toward the circuit board 2, power board 38 or circuit module 20 is counteracted by higher forces developed in the resilient contact members 46 and 50, which is where the tipping originates.

Figure 5:
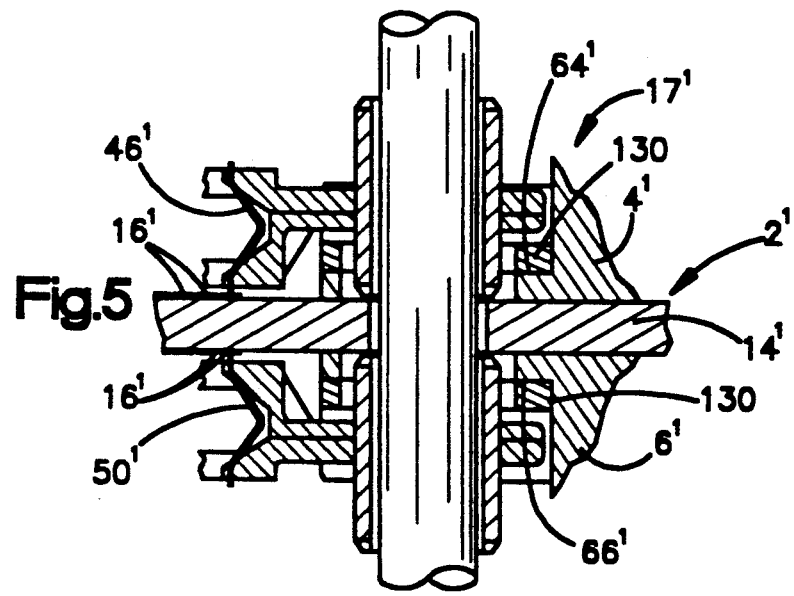
FIG. 5 is a partial sectional view of a circuit board, interposer frame and one pin of a connector assembly, illustrating a second embodiment of the present invention.
Figure 6:
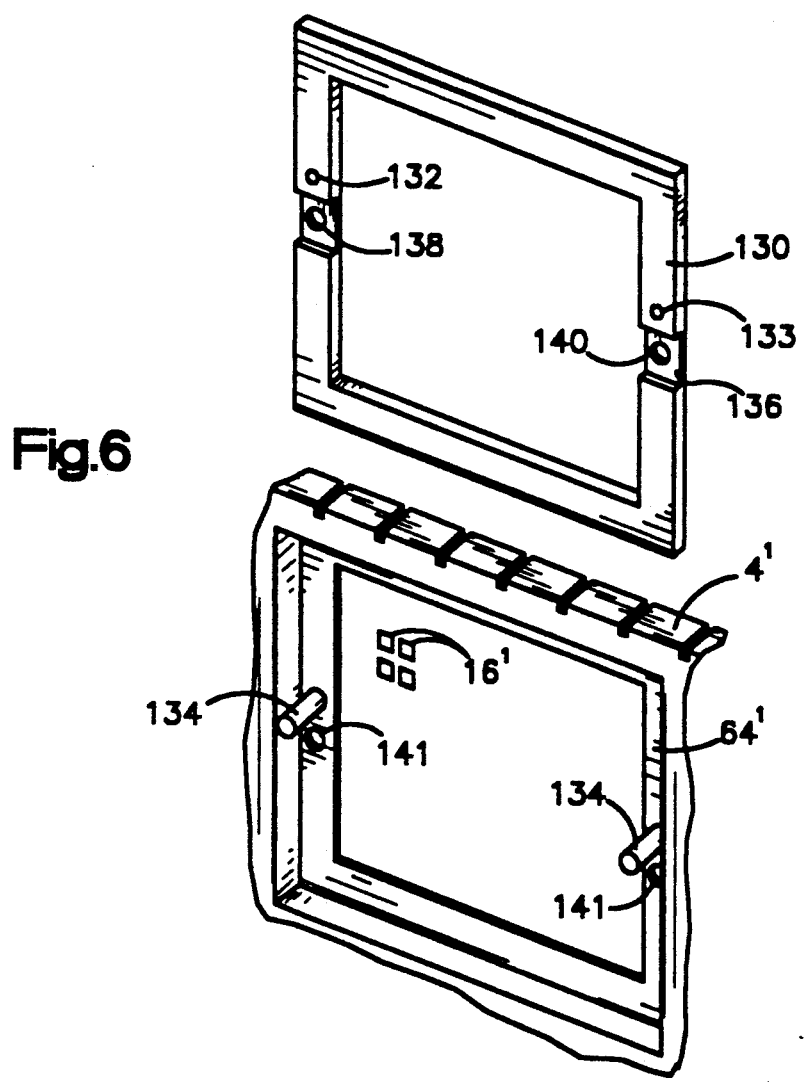
FIG. 6 is a partial perspective view of the circuit board of FIG. 5 but with a part of the circuit board disassembled from the remainder of the circuit board.

Several alternative embodiments of the present invention are illustrated in FIGS. 5 through 12. FIGS. 5 and 6 show a portion of an assembly $17^1$ having ledges $64^1$ and $66^1$ on the stiffener plates $4^1$ and $6^1$ capped with feature plates 130 that enable the positional tolerances to be increased between the circuit board contact pads $16^1$ and the stiffener plates $4^1$ and $6^1$. As shown in FIG. 6, each feature plate 130 has a hole 132 and a slot 133 that fit on posts 134 on the stiffener plates $4^1$ and $6^1$ (only the stiffener plate $4^1$ is shown in FIG. 6). In addition, the feature plates 130 have recesses 136, round openings 138 and slots 140 that correspond to the recesses 68 and 70, round openings 10 and slots 12 in the stiffener plates 4 and 6 of the original embodiment. Round openings 141 in the stiffener plates $4^1$ and $6^1$ are larger than the round openings 138 and the widths of slots 140. The round openings 141 accommodate the increased positional tolerances between the contact pads $16^1$ and stiffener plates $4^1$ and $6^1$. After the stiffener plates $4^1$ and $6^1$ are fixed to the main body $14^1$ of the circuit board $2^1$, the positions of the posts 134 on these plates relative to the contact pads $16^1$ are carefully measured. Based on that positional data, the holes 132 and slots 133 in the feature plates 130 are then machined so that the openings 138 and slots 140 are registered in their proper positions relative to the pads $16^1$ when the feature plates 130 are assembled on the posts 134 of the stiffener plates $4^1$ and $6^1$.

FIGS. 7 and 8 show an edge view of an embodiment of the present invention that is the same as the embodiment of FIGS. 1 through 4, except for the addition of spring loaded plungers 142 that are placed in each of the four corners of the frame 22 of circuit member 18 (FIG. 7) and spring loaded plungers 144 placed in each of the four corners of power board 38 of circuit member 36 (FIG. 8). Headed pins 146 connect the interposer frames 44 and 48 to the circuit members 18 and 36 before they are assembled with the other parts of assembly 17. Thus, during storage and handling of the circuit members 18 and 36 and their attached interposer frames 44 and 48, the plungers 142 and 144 extend outwardly and minimize damage to the ends of the connect members 46 and 50. When the circuit member 18 and interposer frame 44 are assembled with the circuit board 2, the plungers 142 slide through holes 145, shown in FIG. 1, located in the corners of ledges 64 of the stiffener plate 4. The plungers 144 of the circuit member 36 slide through holes similar to holes 145, located in the corners of ledges 66 of stiffener plate 6. The plungers 142 and 144 have lengths such that they contact the main body 14 of the circuit board 2 before the resilient contact members 46 and 50 on the interposer frames 44 and 48 contact their respective pads 16 and 42 on the circuit board 2. When the various parts of the assembly 17 are pressed together, the springs loading the plungers 142 and 144 compress and allow the frame 22 and power board 38 to seat firmly against the ledges 64 and 66 on the stiffener plates 4 and 6.

Figure 9:
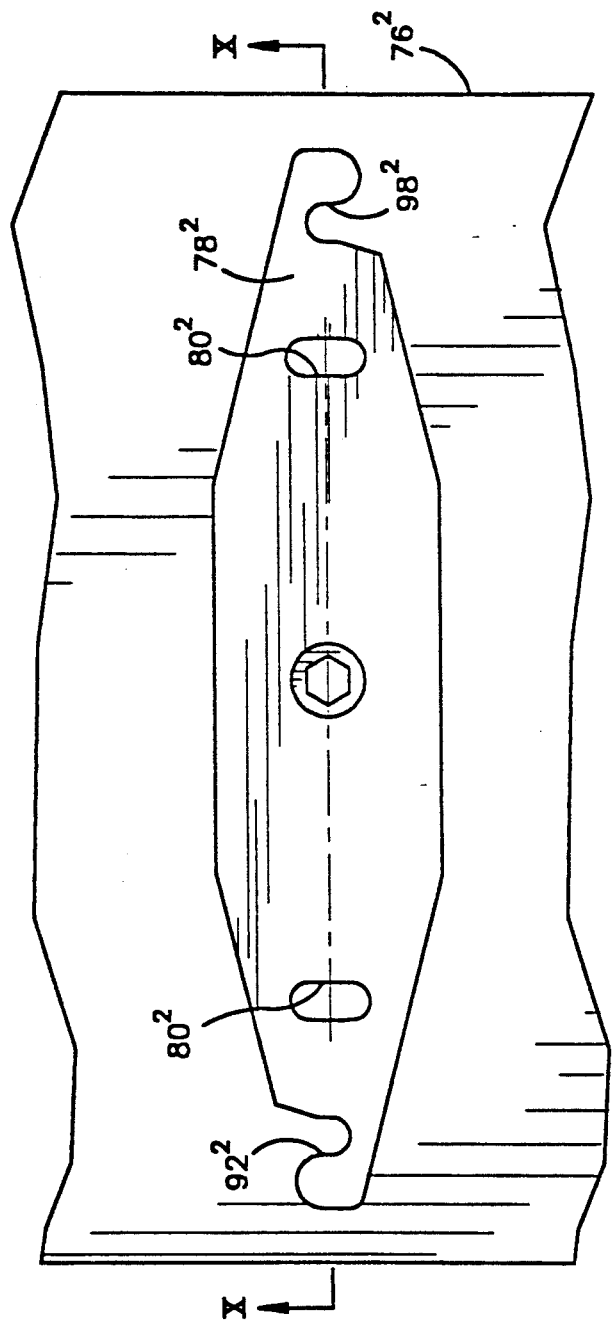
FIG. 9 is a partial top view of parts of a connector assembly illustrating a fourth embodiment of the present invention.
Figure 10:
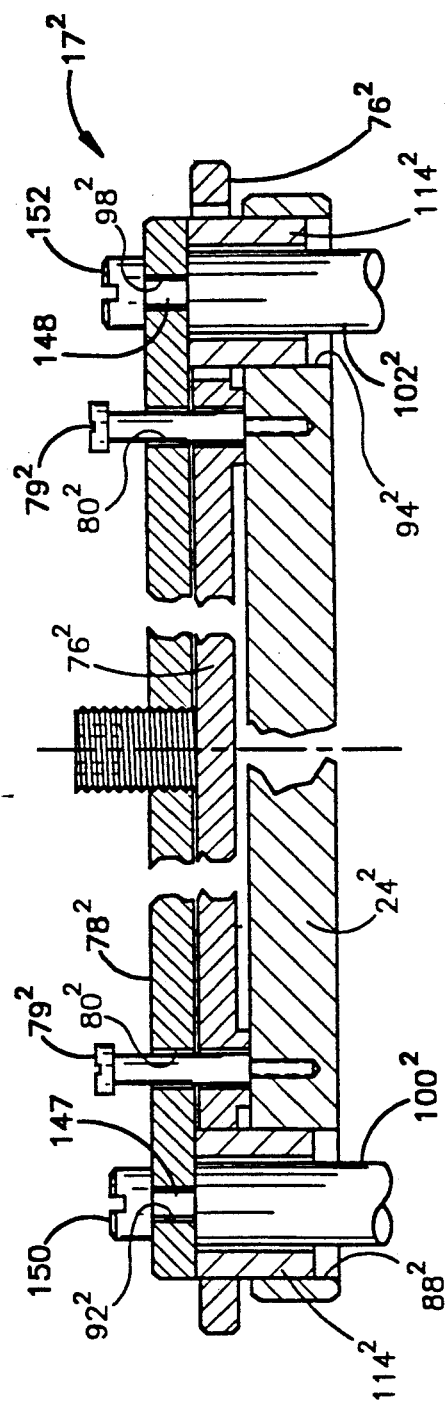
FIG. 10 is a partial sectional view of the parts of the connector assembly of FIG. 9 taken along section line X—X of FIG. 9.

FIGS. 9 and 10 show an embodiment of the invention that has pins $100^2$ and $102^2$ that are permanently attached to the cold plate $40^2$ of the circuit member $36^2$ before the other parts of the connected assembly $17^2$ are assembled. This makes the assembly operation easier. Referring to the partial section of FIG. 10, the pins $100^2$ and $102^2$ have at their top ends neck portions 147 and 148 and caps 150 and 152. In addition, the bushings $114^2$ do not have flanged ends like the bushings 114 of FIGS. 1 to 4. Rather, they are held firmly in round openings $88^2$ and $94^2$ of cooling cap $24^2$. The load distribution plate $76^2$ and actuation bar $78^2$ are positioned on top of the cooling cap $24^2$ by headed pins $79^2$. As shown in FIG. 9, the openings $80^2$ of actuation bar $78^2$ are curved slots that allow the actuation bar $78^2$ to be rotated out of the way of pins $100^2$ and $102^2$ while the attached cooling cap $24^2$ and load distribution plate $76^2$ are slid over the ends of the pins $100^2$ and $102^2$. After that assembly operation has been accomplished, the actuation bar $78^2$ is rotated back into position, with its open-ended slots $92^2$ and $98^2$ engaged in the neck portions 147 and 148 of pins $100^2$ and $102^2$.

Figure 11:
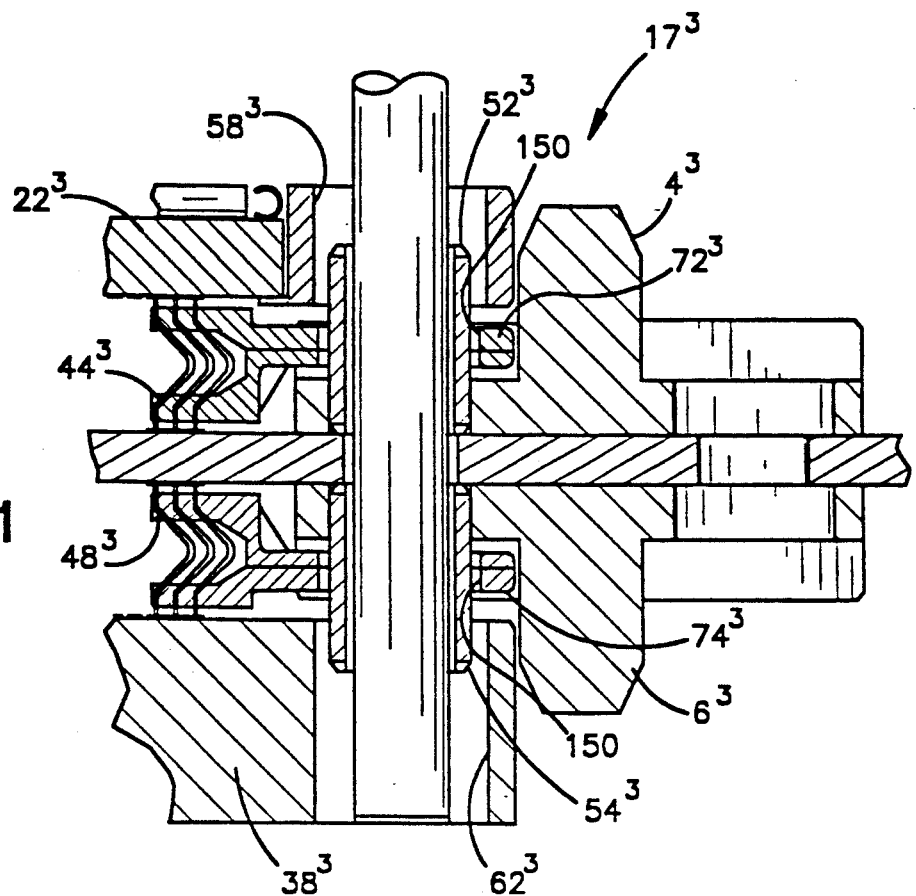
FIG. 11 is a partial sectional view of a circuit board, interposer frame, circuit member and pins of a connector assembly, illustrating a fifth embodiment of the present invention.
Figure 12:
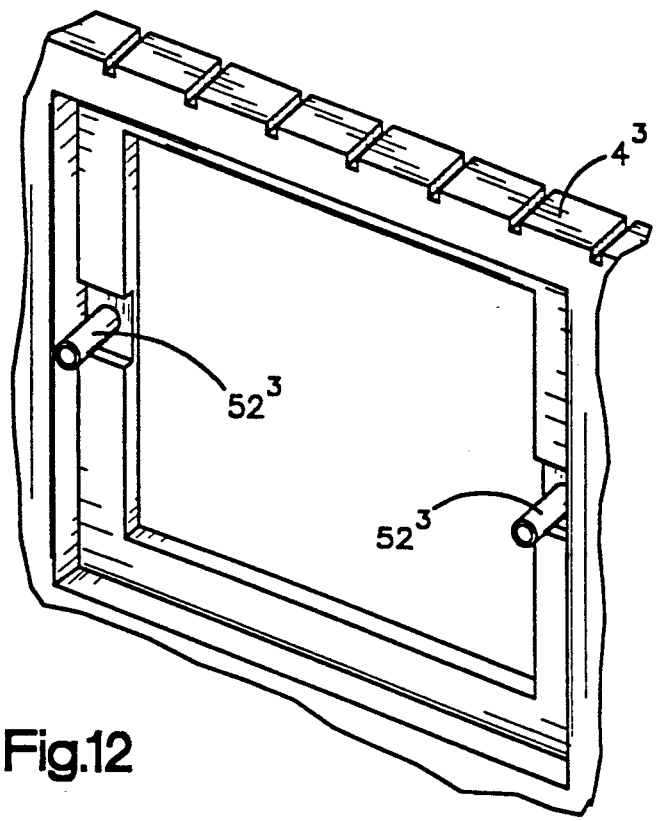
FIG. 12 is a partial perspective view of the connector assembly of FIG. 11.

Still another embodiment of the present invention is shown in FIGS. 11 and 12. In this embodiment, alignment bushings $52^2$ and $54^2$ are permanently secured to the stiffener plates $4^3$ and $6^3$, respectively, rather than to the interposer frames as in the case of the bushings 52 and 54 of the embodiment of FIGS. 1 to 4. The projections $72^3$ and $74^3$ of interposer frames $44^3$ and $48^3$ have openings 150 that are slots on the side of the assembly $17^3$ shown in FIG. 11 and round holes on the other side of the assembly $17^3$ (not shown). The bushings $52^3$ and $54^3$ have the same sliding fit with the openings 150 in the interposer frames $44^3$ and $48^3$ as the bushings 52 and 54 have with the opening 56 and slot 58 of frame 22 and the opening 60 and slot 62 of power board 10 of the embodiment of FIGS. 1 through 4. This embodiment simply shows the alignment bushings on the stiffener plates of the circuit board rather than on the interposer frames.

The foregoing embodiments of the present invention thus illustrate an electrical connector assembly having a single actuation screw as well as alignment means that enable high density electrical circuit members to be simultaneously pressed together under even contact pressure while maintaining their electrical contacts in accurate alignment and under even contact pressure. While these embodiments are the presently preferred embodiments of the invention, other embodiments and changes will be apparent to those skilled in the art without departing from the scope of the following claims.

What is claimed is:

1. A connector assembly for electrically connecting contact pads on a plurality of circuit members, said connector assembly comprising, an interposer frame positioned in each space between said circuit members and resilient contact members supported on the interposer frame extending outwardly toward the contact pads on the circuit members, said circuit members and interposer frame each having a pair of openings, each opening in each pair of openings being aligned with an opening of each of the other pairs of openings, a pair of pins extending through the pairs of aligned openings in said circuit members and interposer frame, an actuation bar positioned between said pins and on the side of one of said circuit members that faces away from all of the other circuit members, said actuation bar having a threaded hole centrally located between said pins, stop devices fixed to said pins on the sides of said actuation bar facing away from said circuit members and on the outer side of the circuit member furthest from said actuation bar, said stop devices limiting the movement of said circuit members, said interposer frames and said actuation bar away from one another, and an actuation screw threadably engaging the hole in said actuation bar and mechanically connected to one of said circuit members, whereby the turning of said actuation screw in said threaded hole forces said circuit members to move simultaneously toward each other thereby compressing said resilient contact members supported on the interposer frames against the contact pads on said circuit members.

2. A connector assembly for electrically connecting contact pads on first and second circuit members to contact pads on respective first and second sides of a circuit board that is positioned between the facing sides of said circuit members, said connector assembly comprising, a first interposer frame positioned between said first circuit member and the first side of said circuit board, a second interposer frame positioned between the said second circuit member and the second side of said circuit board, and resilient contact members supported on said interposer frames and extending outwardly toward the contact pads on the circuit board and the contact pads on one of the circuit members, said circuit board, said interposer frames and said circuit members each having a pair of openings, each opening in each pair of openings being aligned with an opening in each of the other pairs of openings, a pair of pins extending through the pairs of aligned openings in said circuit board, said interposer frames and said circuit members, an actuation bar positioned between said pins and on the side of said first circuit member away from said circuit board, said actuation bar having a threaded hole centrally located between said pins, stop devices fixed to said pins on the side of said actuation bar facing away from said circuit board, and on the side of said second circuit member facing away from said circuit board, said stop devices limiting the movement of said circuit members, said interposer frames and said actuation bar away from said circuit board, an actuation screw threadably engaging the hole in said actuation bar and mechanically connected to the first circuit member, whereby the turning of said actuation screw in said threaded hole forces said first circuit member toward said circuit board and said circuit board toward said second circuit member, thereby compressing said resilient contact members supported on the interposer frames against the contact pads on said first and second circuit members and on the first and second sides of said circuit board.

3. The connector assembly as claimed in claim 2 wherein the openings in said first and second circuit members are registered to the contact pads thereon and the openings in said circuit board are registered to the contact pads on the first and second sides of the circuit board and wherein, said first interposer frame including a pair of first alignment bushings, the pair of openings in said interposer frame being located in said first alignment bushings, said first alignment bushings extending into the registered openings in said first circuit member and into the registered openings in said circuit board and having a close fit with the walls of said registered openings so that the resilient contact members supported on the first interposer frames are aligned with the contact pads on said first circuit member and with the contact pads on the first side of said circuit board, and said second interposer frame including second alignment bushings, the pair of openings in said second interposer frame being located in said second alignment bushings, said second alignment bushings extending into the registered openings in said circuit board and having a close fit with the walls of said registered openings so that the resilient contact members supported on the second interposer assembly are aligned with the contact pads on said second circuit member and with the contact pads on the second side of said circuit board.

4. The connector assembly as claimed in claim 3 wherein said circuit board includes stiffener plates on both sides of the circuit board, the registered openings in the circuit board being located in said stiffener plates, the openings in the stiffener plate on the first side of the circuit board being registered to the contact pads on the first side of the circuit board and the openings in the stiffener plate on the second side of the circuit board being registered to the contact pads on the second side of the circuit board.

5. The connector assembly as claimed in claim 4 wherein said stiffener plates include insert plates on the sides of said stiffener plates facing away from said circuit board, the registered openings in the circuit board being located in said insert plates.

6. The connector assembly as claimed in claim 2 wherein the openings in said first and second circuit members are registered to the contact pads thereon and wherein said circuit board includes first and second stiffener plates mounted respectively on the first and second sides of said circuit board, said first stiffener plate including first alignment bushings registered to the contact pads on the first side of the circuit board, said first alignment bushings extending into the openings in said first interposer frame and the registered openings in said first circuit member, said first alignment bushings having a close fit with the walls of said openings so that the resilient contact members supported on the first interposer frame are aligned with the contact pads on said first circuit member and the contact pads on the first side of said circuit board, and said second stiffener plate including second alignment bushings registered to the contact pads on the second side of the circuit board, said second alignment bushings extending into the openings in said second interposer frame and the registered openings in said second circuit member, said second alignment bushings having a close fit with the walls of said openings so that the resilient contact members supported on the second interposer frame are aligned with the contact pads on said second circuit member and the contact pads on the second side of said circuit board, the pair of openings in said circuit board being located in said alignment bushings.

7. The connector assembly as claimed in claim 2 comprising also, a load distribution plate positioned between said first circuit member and said actuation bar and having a bossed portion that contacts the shoulder portions of said first circuit member and maintains the central portion of the load distribution plate free from contact with the central portion of the first circuit member, said actuation screw contacting the central portion of the load distribution plate so that the force generated by the turning of said actuation screw is distributed by the load distribution plate through said bossed portion to the shoulder portions of said first circuit member.

8. The connector assembly as claimed in claim 7 wherein,
said load distribution plate has a pair of holes located in spaced apart locations in the vicinity of said bossed portion, said actuation bar also having holes axially aligned with the shoulder holes in said load distribution plate, and a pair of headed pins anchored to said first circuit member and extending through said holes in said load distribution plate and said actuation bar.

9. The connector assembly as claimed in claim 3 comprising also,
a load distribution plate positioned between said first circuit member and said actuation bar and having a bossed portion that contacts the shoulder portions of said first circuit member and maintains the central portion of the load distribution plate free from contact with the central portion of the first circuit member, said actuation screw contacting the central portion of the load distribution plate so that the force generated by the turning of said actuation screw is distributed by the load distribution plate through said bossed portion to the shoulder portions of said first circuit member.

10. The connector assembly as claimed in claim 4 comprising also,
a load distribution plate positioned between said first circuit member and said actuation bar and having a bossed portion that contacts the shoulder portions of said first circuit member and maintains the central portion of the load distribution plate free from contact with the central portion of the first circuit member, said actuation screw contacting the central portion of the load distribution plate so that the force generated by the turning of said actuation screw is distributed by the load distribution plate through said bossed portion to the shoulder portions of said first circuit member.

11. The connector assembly as claimed in claim 3 wherein said alignment bushings have cylindrical outer surfaces, one of the openings in each of said circuit members and circuit board has a cylindrical wall in sliding engagement with the cylindrical outer surface of one of said alignment bushings and the other of the openings in each of said circuit members and circuit board is a slot with an axis of elongation substantially aligned with the line between the centers of the openings in each member or board, said slot having the portions of its wall that are parallel to said axis in sliding engagement with the cylindrical surface of one of said alignment bushings.

12. The connector assembly as claimed in claim 4 wherein said alignment bushings have cylindrical outer surfaces, one of the openings in each of said circuit members and interposer frame has a cylindrical wall in sliding engagement with the cylindrical outer surface of one of said alignment bushings and the other of the openings in each of said circuit members and interposer frame is a slot with an axis of elongation substantially aligned with the line between the centers of the openings in each member or board, said slot having portions of its wall that are parallel to said axis in sliding engagement with the cylindrical surface of one of said alignment bushings.

13. The connector assembly as claimed in claim 2 wherein the first circuit member comprises a circuit member frame having inwardly projecting ledges, a circuit module supported on said ledges within said circuit member frame, the contact pads on said first circuit member being located on the side of said circuit module facing toward said circuit board, and a cooling cap positioned on the side of the circuit module and circuit member frame facing away from said circuit board, said circuit module having springs positioned between said cooling cap and said circuit module forcing said circuit module against said ledges on said circuit member frame, said openings in said first circuit member through which said pins extend being located in said circuit member frame and said cooling cap.

14. The connector assembly as claimed in claim 2 wherein said second circuit member comprises a power board, the contact pads on said second circuit member being located on the side of said power board facing toward said circuit board, and a cold plate positioned on the side of said circuit board facing away from said circuit board, said openings in said second circuit member through which said pins extend being located in said power board, the ends of said pins being anchored in said cold plate, said cold plate thereby forming the stop devices on said pins on the side of the second circuit member facing away from said circuit board.

15. The connector assembly as claimed in claim 13 wherein said second circuit member comprises a power board, the contact pads on said second circuit member being located on the side of said power board facing toward said circuit board, and a cold plate positioned on the side of said circuit board facing away from said circuit board, said openings in said second circuit member through which said pins extend being located in said power board, the ends of said pins being anchored in said cold plate, said cold plate thereby forming the stop devices on said pins on the side of the second circuit member facing away from said circuit board.

16. The connector assembly as claimed in claim 3 wherein the first circuit member comprises a circuit member frame having inwardly projecting ledges, a circuit module supported on said ledges within said circuit member frame, the contact pads on said first circuit member being located on the side of said circuit module facing toward said circuit board, and a cooling cap positioned on the side of the circuit module and circuit member frame facing away from said circuit board, said circuit module having springs positioned between said cooling cap and said circuit module forcing said circuit module against said ledges on said circuit member frame, said openings in said first circuit member through which said pins extend being located in said circuit member frame and said cooling cap.

17. The connector assembly as claimed in claim 16 wherein said second circuit member comprises a power board, the contact pads on said second circuit member being located on the side of said power board facing toward said circuit board, and a cold plate positioned on the side of said circuit board facing away from said circuit board, said openings in said second circuit member through which said pins extend being located in said power board, the ends of said pins being anchored in said cold plate, said cold plate thereby forming the stop devices on said pins on the side of said second circuit member facing away from said circuit board.

18. The connector assembly as claimed in claim 3 wherein said second circuit member comprises a power board, the contact pads on said second circuit member being located on the side of said power board facing toward said circuit board, and a cold plate positioned on the side of said circuit board facing away from said circuit board, said openings in said second circuit member through which said pins extend being located in said power board, the ends of said pins being anchored in said cold plate, said cold plate thereby forming the stop devices on said pins on the side of said second circuit member facing away from said circuit board.

19. The connector assembly as claimed in claim 15 wherein said cold plate has threaded holes and said pins have threaded ends that engage said threaded holes to anchor the pins in the cold plate, said pins having flanges at their ends adjacent said actuation bar, said flanges forming the stop devices on the side of said actuation bar that faces away from said circuit board.

20. The connector assembly as claimed in claim 19 wherein said actuation bar extends over the openings in said first circuit member and has holes aligned with said first circuit member openings, and wherein the connector assembly additionally comprises
stabilizing bushings extending through the openings in said first circuit member and said holes in the actuation bar, said stabilizing bushings having flanges that engage the side of said actuation bar that faces away from said circuit board, said flanges on said pins engaging the flanges on the stabilizing bushings to limit the movement of said first interposer assembly, said first circuit member and said actuation bar away from said circuit board.

21. The connector assembly as claimed in claim 18 wherein said cold plate has threaded holes and said pins have threaded ends that engage said threaded holes to anchor the pins in the cold plate, said pins having flanges at their ends adjacent said actuation bar, said flanges forming the stop devices on the side of said actuation bar that faces away from said circuit board.

22. The connector assembly as claimed in claim 21 wherein said actuation bar extends over the openings in said first circuit member and has holes aligned with said first circuit member openings, and wherein the connector assembly additionally comprises
stabilizing bushings extending through the openings in said first circuit member and said holes in the actuation bar, said stabilizing bushings having flanges that engage the side of said actuation bar that faces away from said circuit board, said flanges on said pins engaging the flanges on the stabilizing bushings to limit the movement of said first interposer assembly, said first circuit member and said actuation bar away from said circuit board.

23. The connector assembly as claimed in claim 15 wherein said actuation bar extends over the openings in said first circuit member and has slots that are alignable with said openings, said slots having ends opening into opposite longitudinal edges of the actuation bar, said pins having narrowed neck portions adjacent said actuation bar and cap portions beyond the narrowed neck portions on the side of the actuation bar facing away from the circuit board, said actuation bar thereby forming a locking engagement between narrowed neck portions of the pins and the slots in the actuation bar, with the cap portions of the pins forming the stop devices that limit the movement of said circuit members, said interposer frames and said actuation bar away from said circuit board.

24. The connector assembly as claimed in claim 23 additionally comprising,
stabilizing bushings extending through the openings in said first circuit member, the ends of said stabilizing bushings engaging the surface of said actuation bar adjacent the said slots in the actuation bar.

25. The connector assembly as claimed in claim 2 wherein headed pins connect said first and second interposer frames respectively to said first and second circuit members and spring loaded plungers are mounted on said circuit members so as to face toward said circuit board, said spring loaded plungers being of sufficient length to project beyond the ends of the resilient contact members on said interposer frames to minimize damage to the resilient contact members during storage and handling prior to final assembly of said connector assembly.

26. The connector assembly as claimed in claim 15 wherein headed pins connect said first and second interposer frames respectively to said cirucit member frame and said power board and spring loaded plungers are mounted on said circuit member frame and power board so as to face toward said circuit board, said spring loaded plungers being of sufficient length to project beyond the ends of the resilient contact members on said interposer frames to minimize damage to the resilient contact members during storage and handling prior to final assembly of said connector assembly.

* * * * *